United States Patent
Gao (10) Patent No.: US 11,937,401 B2
(45) Date of Patent: Mar. 19, 2024

(54) SYSTEM DESIGN AND OPERATION FOR LIQUID COOLING

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 30 days.

(21) Appl. No.: 17/354,378

(22) Filed: Jun. 22, 2021

(65) Prior Publication Data
US 2022/0408597 A1  Dec. 22, 2022

(51) Int. Cl.
H05K 7/20 (2006.01)

(52) U.S. Cl.
CPC ..... *H05K 7/20281* (2013.01); *H05K 7/20272* (2013.01); *H05K 7/20254* (2013.01)

(58) Field of Classification Search
None
See application file for complete search history.

(56) References Cited

U.S. PATENT DOCUMENTS

| | | | | |
|---|---|---|---|---|
| 2004/0025949 A1* | 2/2004 | Wygnaski | ............. | F16K 31/082 137/66 |
| 2012/0111037 A1* | 5/2012 | Campbell | .......... | H05K 7/20809 62/159 |
| 2016/0161310 A1* | 6/2016 | Leaders | ................... | G01F 1/663 702/48 |
| 2017/0181328 A1* | 6/2017 | Shelnutt | ..................... | G06F 1/20 |
| 2018/0084676 A1* | 3/2018 | Edwards | ................. | F04D 13/12 |
| 2019/0363485 A1* | 11/2019 | Franz | .................. | H01R 13/5219 |
| 2019/0373776 A1* | 12/2019 | Gao | ..................... | H05K 7/20772 |
| 2022/0240422 A1* | 7/2022 | Heydari | ..................... | G06F 1/20 |

* cited by examiner

*Primary Examiner* — Courtney L Smith
(74) *Attorney, Agent, or Firm* — WOMBLE BOND DICKINSON (US) LLP (57) ABSTRACT

An electronic rack includes a rack manifold to be coupled to an external cooling fluid source, including a supply rack manifold and a return rack manifold, wherein the rack manifold includes a plurality of pairs of rack connectors disposed thereon. The electronic rack further includes a server chassis including a connector holder having a pair of a supply server connector and a return server connector to be connected with a corresponding pair of rack connectors of the rack manifold. The electronic rack further includes a controller, in response to detecting a leakage of the cooling fluid, configured to cause the supply server connector to disconnect from the supply rack manifold, while maintaining the return server connector connected with the return rack manifold, and to increase a flowrate of the cooling fluid on the return rack manifold to remove the cooling fluid residing within the server chassis.

18 Claims, 10 Drawing Sheets

SYSTEM DESIGN AND OPERATION FOR LIQUID COOLING

FIELD OF THE INVENTION

Embodiments of the present invention relate generally to the electronics cooling, cooling hardware and package, liquid cooling etc. More particularly, embodiments of the invention relate to a system design and operation for liquid cooling.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

It is important to keep high reliability in liquid cooling. Therefore, minimizing the impact of leakage damage is important for deploying this technology in data centers on a large scale. It is critical to develop solutions which can minimum the impact due to the leaked fluid in a liquid cooling leakage incident.

The conventional solutions may shut down the system during a leaking scenario; however, shutting down the system requires introducing individual fluid components to achieve the server level control. This design may thus require the introduction of individual fluid components to achieve the server level control. Similarly, those conventional solutions may not be able to minimize the amount of the fluid leaking or the amount of fluid exposed to the electronics. However, none of the existing solutions may qualify or be appropriate for server liquid or electronics cooling.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The information technology (IT) hardware industry is a critical market for many reasons: it plays a crucial role in business competitiveness, service quality and availability, and also plays a significant role in the infrastructure total cost of ownership (TCO). IT hardware is closely linked with the profit of an organization. It is one of the core competencies of the internet giant, cloud computing service providers, as well as high performance computing and artificial intelligence (AI) computing related business service users and providers who build, operate, compute, store and manage other IT hardware platforms (e.g., servers) and infrastructures. The majority of the hyper-scale owners are customizing full-stacks of these hardware systems. For instance, in the rapidly growing cloud computing business, the performance and cost (both capital cost and operation cost) of computing and storage hardware systems, clusters and infrastructure, all require the service providers to create customized systems that fit their individual needs the best. These markets require continuous innovation. An efficient system design and operation benefits the service providers in multiple aspects in a long term. The key to this is to develop continuously with more resilience, efficiency, interoperable and cost effective solutions and architecture.

The disclosure aims to provide an overall system architecture for a liquid cooling solution, including a hardware system and operation strategy, which accommodates a multitude of leakage scenarios occurring in the liquid cooling system. This system is especially critical when it comes to the leakage response system. In addition, the following items serve as additional challenges that the current work aims to solve: to minimize the impact of leakage damage, to decrease the volume of the fluid during leaking, to prevent the leakage from impacting other systems, to perfect the system, rack, and server co-design, to increase system reliability, and to deploy the system in different architecture systems that are either localized pumping systems or central pumping systems.

The present application includes a server level design using individual connector modules. In an embodiment, the connector modules are assembled with electromagnetic devices to control the connections and disconnections of the supply and return connectors separately. For example, the DC power is supplied and distributed to two electromagnetic devices while each supply circuit is designed with a switch. In some embodiments, the rack flow is controlled by either a localized pump, or a valve in a central pumping system. In an embodiment, sensors are used for detecting leakage. For example, during a leakage incident, the sensor will enable to firstly, disconnect the supply side connector to cut off the supply fluid, and secondly, to adjust the returning fluid flow rate through pump or valve, while thirdly, disconnecting the return fluid connector altogether.

According to one aspect, an electronic rack includes a rack manifold to be coupled to an external cooling fluid source, including a supply rack manifold and a return rack manifold. The rack manifold includes a plurality of pairs of rack connectors disposed thereon to receive and to return cooling fluid from and to the external cooling fluid source via the supply rack manifold and the return rack manifold. The electronic rack further includes a server chassis including a connector holder having a pair of a supply server connector and a return server connector to be connected with a corresponding pair of rack connectors of the rack manifold. The supply and return server connectors are configured to distribute the cooling fluid to one or more cooling devices attached to one or more electronic devices contained within the server chassis for liquid cooling. The electronic rack further includes a controller, which in response to detecting a leakage of the cooling fluid, is configured to cause the supply server connector to disconnect from the supply rack manifold, while maintaining the return server connector connected with the return rack manifold, and to increase a flowrate of the cooling fluid on the return rack manifold to remove the cooling fluid residing within the server chassis.

In one embodiment, the server chassis further includes a leakage detection sensor to detect the fluid leakage within the server chassis. In one embodiment, to increase the flowrate of the cooling fluid, the controller causes the pump speed of a fluid pump to increase. The fluid pump is located between the return rack manifold and a facility fluid return line of a data center room. The facility fluid return line is coupled to a number of electronic racks in the data center room. In one embodiment, the pump speed of the fluid pump is increased to its maximum speed. In another embodiment, to increase the flow rate of the cooling fluid, the controller causes opening of a valve between the return rack manifold and the facility return line to increase, for example, to its maximum opening.

In one embodiment, the controller further causes the return server connector to disconnect from the return rack manifold after a predetermined period of time after the supply server connector has been disconnected from the supply rack manifold. In another embodiment, the controller further causes the return server connector to disconnect from the return rack manifold after a predetermined amount of cooling fluid has been removed from the server chassis.

Figure 1:
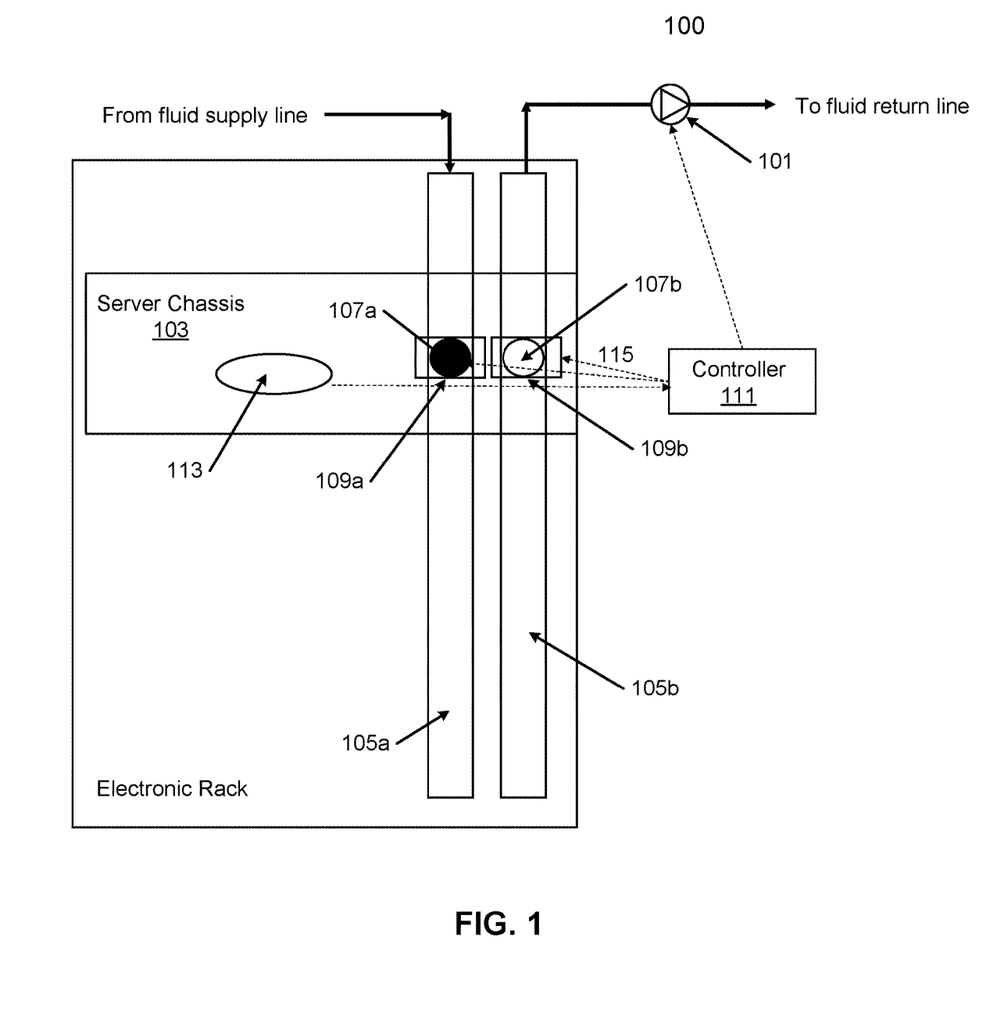
FIG. 1 shows a rack level design with a pump according to an embodiment of the application.

FIG. 1 shows a rack level design 100 with a pump 101 according to an embodiment of the application. FIG. 1 shows a rear view of an electronic rack. In particular, FIG. 1 shows the design concept introduced in the present application. For example, FIG. 1 shows the system design 100 using a localized pump 101 disposed on a fluid return path of an electronic rack. In an embodiment, the server chassis 103 are connected to the rack manifold 105a, 105b through the blind mating connectors 107a, 107b. Server chassis 103 may contain one or more servers operating therein. Each server may include a processor, memory, a storage device, etc. that may generate heat during the operations. Although there is only one server 103 shown, there may be multiple server chassis arranged in a stack within the electronic rack. The connectors 107a and 107b are assembled with electromagnet devices 109a and 109b which enable to generate displacement to disconnect the connectors from the rack connectors in leakage incidents.

In an embodiment, an electromagnet device (e.g., 109a, 109b) is deployed between server chassis 103 and rack manifold (e.g., 105a, 105b). In an embodiment, the blind mating connectors (e.g., 107a, 107b) are disconnected in a leaking incident, automatically triggered 115 (e.g., controlled by a controller 111 in response to a leakage signal obtained from leakage sensor 113) by the incident without any complex or a control.

In an embodiment, it can be seen that the blind mating connectors 107a, 107b requires the proper placement of the two to be able to function properly. For example, two arrows 115 shown in the FIG. 1 represent the electromagnet device (e.g., 109a, 109b) as well as its function: to push the server connector (e.g., 107a) away from the rack manifold (e.g., 105a) to disconnect the server liquid cooling loops from the rack distribution manifold.

In an embodiment, a leaking sensor 113 is configured to detect leakage of the cooling fluid within the server chassis 103. In an embodiment, an electromagnet device (e.g., 109a 109b) is coupled to the server connector module (e.g., 107a, 107b) and the leaking sensor 113. Although not shown, server chassis 103 may contain one or more liquid cooling devices such as cold plates attached to one or more electronic devices (e.g., processors). The cooling devices are fluidly coupled to the rack manifold vis the server connectors engaged with the rack connectors. In the event of the cooling fluid leakage, leakage sensor 113 may detect such leakage. In response to the leakage detected by leakage sensor 113, a controller 111 is configured to control the server connector module i.e., the electromagnetic device (e.g., 109a, 109b) of the connector module to move away from the rack manifold (e.g., 105a 105b), either moving together with the server chassis or moving only the connector module while the server chassis remains steady.

In an embodiment, the design 100 includes the rack fluid return side is assembled with a pump 101 to adjust a returning fluid flow rate of the cooling fluid. For example, when the supply server connector 107a is disengaged from the supply rack connector in response to the leakage signal received from the leaking sensor 113 indicating that the fluid leakage occurs, controller 111 causes the sever return connector to disconnect from the rack manifold on the supply side, while keeping the return side intact. The controller 111 then causes the pump 101 to increase the returning fluid flow rate of the cooling fluid while the return server connector 107b remains engaged with the return rack connector. In one embodiment, controller 111 sends a control signal or command to pump 101 to instruct pump 101 to operate at its maximum speed to remove residual cooling fluid from sever chassis 103. After a predetermined period of time, the server connector on the return side is disconnected from the rack manifold. Alternatively, after all or a predetermined amount of residual cooling fluid has been removed from server chassis 103, the server connector on the return side is disconnected from the rack manifold.

Figure 2:
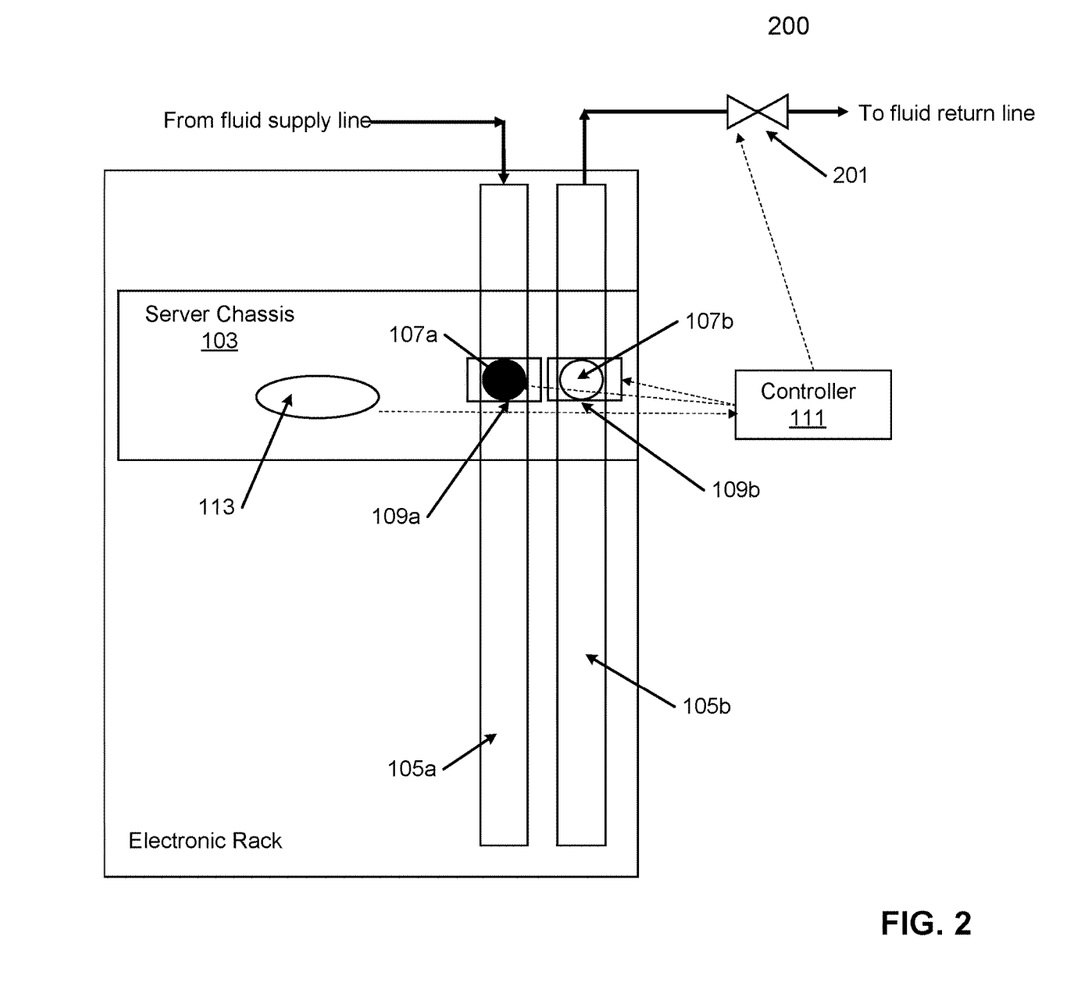
FIG. 2 shows a rack level design with valve according to an embodiment of the application.

FIG. 2 shows a rack level design 200 with valve 201, according to an embodiment of the application. For example, FIG. 2 shows the rack level design 200 using a valve 201. And in this design, the valve 201 will not set to maximum open ratio, and will set to maximum open ratio through the controller 111 in a leakage incident.

In an embodiment, rack level design 200 includes the rack fluid return side assembled with a valve 201 to adjust a returning fluid flow rate of the cooling fluid. For example, when the supply server connector 107a disengaged from the supply rack connector in response to the leakage signal received from the leaking sensor 113 indicating that the fluid leakage occurs, the valve 201 increases the returning fluid flow rate of the cooling fluid while the return server connector 107b remains engaged with the return rack connector. After a predetermined period of time, the server connector on the return side is disconnected from the rack manifold. Alternatively, after all or a predetermined amount of residual cooling fluid has been removed from server chassis 103, the server connector on the return side is disconnected from the rack manifold.

Figure 3A:
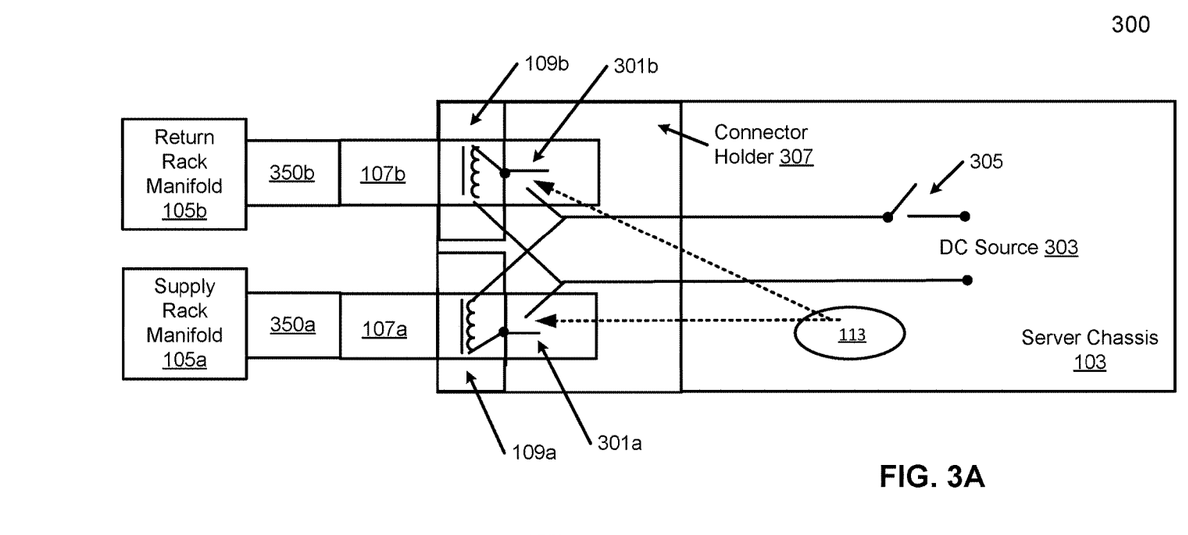
FIGS. 3A and 3B show an example of a server level design for the server liquid cooling fluid cutoff system according to certain embodiments of the application.
Figure 3B:
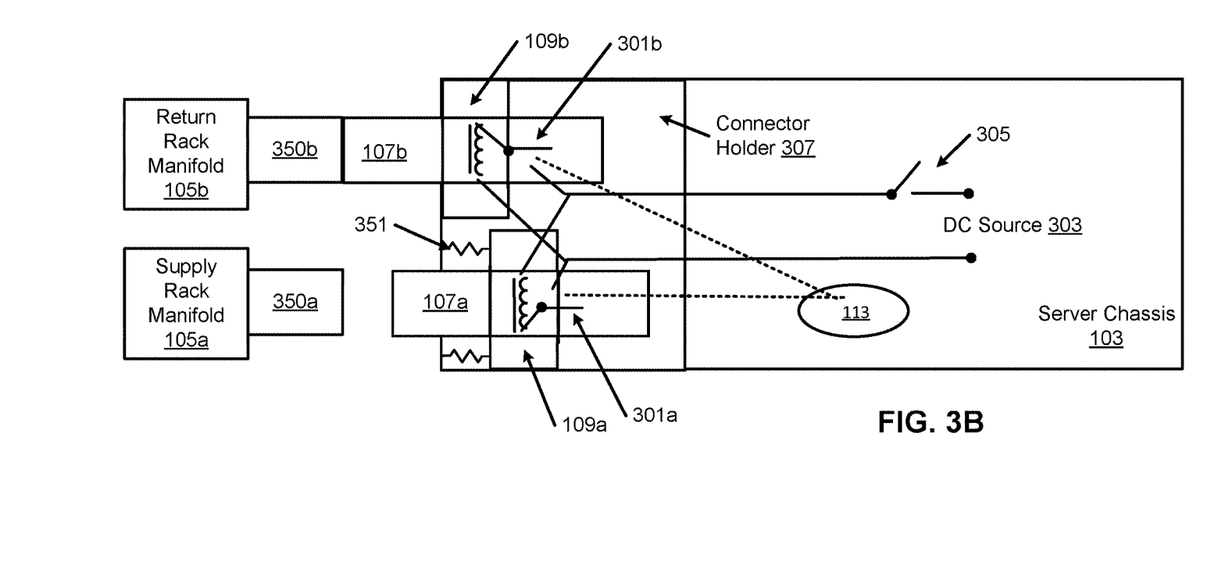

FIGS. 3A-3B show a server level design 300 according to an embodiment of the application. FIGS. 3A-3B show a top view of the server level design 300, which can be seen that the two electromagnet devices 109a and 109b used on the connector holder 307 which the blind mating connectors are assembled on. In an embodiment, the electromagnet unit are powered up by the server DC power source 303 and each of the electromagnet devices 109a and 109b is controlled by a switch. For example, switch 301a is used to provide power to electromagnetic device 109a associated with connector 107a; and switch 301b is used to provide power to electromagnetic device 109b associated with connector 107b.

In an embodiment, an electromagnetic device having an electromagnet therein is maintained in the connector holder 307. The electromagnetic device is fixedly attached to a server connector and contained within the connector holder 307. In an embodiment, the electromagnet (e.g., 109a, 109b) is connected to an electrical circuit with a DC voltage source 303, which may be provided within server chassis 103. In an embodiment, switch 305 is used on the circuit coupled to DC source 303. In an embodiment, the switch 305 is controlled directly by a controller (not shown) in response to a signal received from the leaking sensor 113.

Switch 305 may be used as a main power supply switch to provide or cut off power to both electromagnetic devices 109a and 109b, as well as other components within server chassis 103. In addition, switches 301a and 301b are used to provide power or to cut off power to electromagnetic devices 109a and 109b respectively. Switches 301a and 301b may be controlled individually or independently by a controller in response to certain incidents such as cooling fluid leakage.

In one embodiment, in response to a fluid leakage, the controller causes switch 301a to be opened to remove power from electromagnetic device 109a on the supply side. Switch 301b remains closed to continue provide a return fluid connection between return rack manifold 105b and server chassis 103 on the return side, such that the remained fluid in server chassis 103 can be removed. After a predetermined period of time, switch 301b may be switched off to disconnect the return fluid connection on the return side.

In an embodiment, when switch 301a is switched off, the loss of power from the DC source causes the loss of magnetism, which could cause the server connector 107a and the electromagnet 109a to move altogether in the positive horizontal directions, in this example, from left to right and away from the corresponding rack connector 350a as shown in FIG. 3B. Rack connector 350a is also referred to as a supply rack connector. In an embodiment, as a result (e.g., in FIG. 3B), the server supply blind mating connector 107a is disconnected from the corresponding rack connector 350a of the supply rack manifold 105a. In an embodiment, when the force provided by the magnetism is loss, an elastic structure, such as spring 351, may be used for the connector 107a and the electromagnet 109a to move in the positive horizontal directions (e.g., from left to right in this example in FIG. 3B). For example, elastic structure 351 can be a spring based structure located on the left hand side of the electromagnet between the server chassis 103 and electromagnetic device (e.g., 109a and 109b).

In an embodiment, the loss of the DC source causes the loss of magnetism, which could cause the corresponding electromagnetic device such as electromagnetic devices 109a and 109b (together with the server connector such as connectors 107a and 107b) to move away from rack manifold 105a and 1054b. In one embodiment, the electromagnetic device moves together with the corresponding server connector attached thereon, while connector holder 307 and server chassis 103 remain steady. As a result, the server connector (e.g., 107a, 107b) are disconnected from the corresponding rack connector of the rack manifold (e.g., 350a, 350b).

Referring to FIG. 3A, when server chassis 103 is inserted into an electronic rack from the frontend, server chassis 103 is engaged with rack manifold 105 (including supply rack manifold 105a and return rack manifold 105b). Server connector 107a is connected with rack connector 350a and server connector 107b is connected with rack connector 350b (also referred to as a return rack connector). Meanwhile, power from DC source 303 is supplied to electromagnetic devices 109a and 109b, which generate respective magnetic forces. Typically, the server chassis 103 is made of metal. The magnetic forces attract or pull electromagnetic devices 109a and 109b (together with their respective server connectors 107a and 107b) towards the rear panel of server chassis 103 and rack manifolds 105a and 105b.

In this situation, an elastic structure such as a spring 351 disposed between the electromagnetic devices 109a-109b and the rear end of server chassis 103 (or connector holder 307) is compressed. In response to determining a fluid leakage, which is detected by sensor 113, a controller (not shown) sends a signal to remove the power from electromagnetic deice 109a on the supply side. For example, the controller causes the switch 301a to cut off the power to electromagnetic device 109a. Without the power, electromagnetic device 109a would not generate the magnetic force to pull electromagnetic device 109a and server connector 107a towards supply rack manifold 105a. In this situation, elastic structure 351 is released or decompressed, which pushes electromagnetic device 109a and server connector 107a away from the rack manifold 105a and towards the frontend of server chassis 103, while connector hold 307 and server chassis 103 remain steady. As a result, server connector 107a and rack connector 305a is disconnected as shown in FIG. 3B.

Note that the location of elastic structure 351 as shown is for illustration purpose only. Elastic structure 351 can be disposed between electromagnetic device 109a and a frontend of connector holder 307 (e.g., away from rack manifolds 105a and 105b). During the normal operations with power supplied to electromagnetic device 109a, elastic structure 351 (in this example, a spring) is a stretched state. When the power is removed from electromagnetic device 109a, elastic structure 351 recovers to its neural state, which pulls electromagnetic device 109a together with server connector 107a away from rack manifold 105a. As a result, rack connector 350a and server connector 107a are disconnected. Similar operations are performed to disconnect rack connector 350b and server connector 107b on the return side.

Similar operations may be performed on the return side to disconnect rack connector 350b and server connector 107b on the return side. In one embodiment, the controller causes switch 301b to be switched off after a predetermined period of time after switch 301a has been switched off. Such a delay of cutting off power from the return side would allow the cooling fluid to be removed from server chassis 103.

Further, in an embodiment, there are some additional important features which can be integrated into the present application. For example, since the device is DC source 303 based, it's much more accessible to be designed and operated upon since the power source is cut off in a leaking incident. In an embodiment, this can be directly utilizing the power cutoff signal and control, and/or server shutdown sequence.

Figure 4:
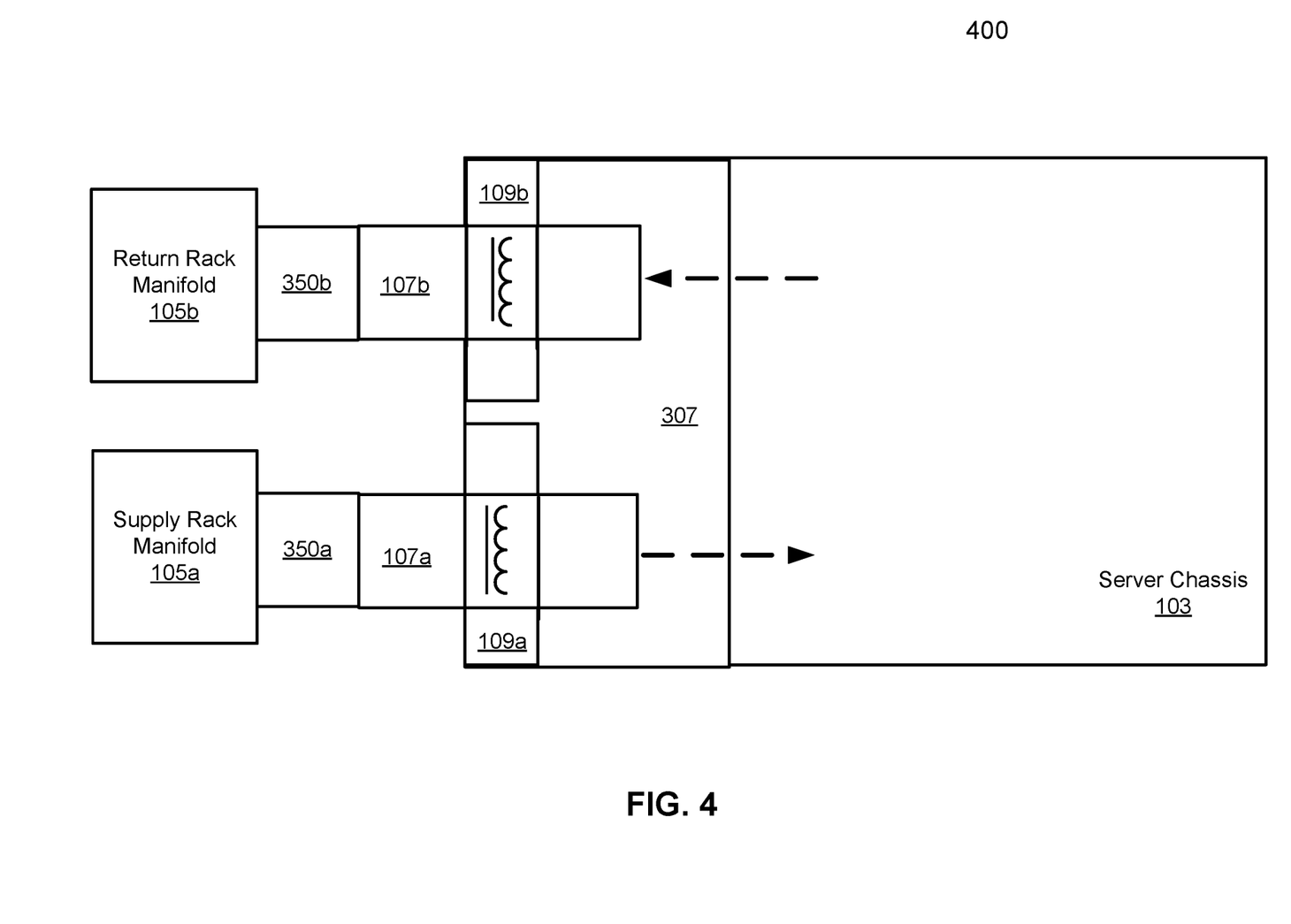
FIG. 4 shows a server normal operating mode of the server liquid cooling fluid cutoff system according to an embodiment of the application.

FIG. 4 shows a server normal operating 400 for the server liquid cooling fluid cutoff system according to an embodiment of the application. For example, FIG. 4 shows normal operation 400 and fluid flowing through the server 103.

In an embodiment, a rack manifold (e.g., 105a, 105b) of the electronic rack coupled to an external cooling fluid source to receive and to return cooling fluid from and to the external cooling fluid source. For example, the rack manifold (e.g., 105a, 105b) includes a number of pairs of rack blind mating connectors (e.g., 350a, 350b), each pair including a supply rack connector to allow fluid to flow from the rack manifold 105a to a server chassis 103, and a return rack connector to allow the fluid to flow from the server chassis 103 to the rack manifold 105b.

In an embodiment, the server connector module is attached onto a rear side of the server chassis 103 within the server chassis. In an embodiment, the pair of server blind mating connectors include the supply server connector 107a coupled with the server chassis 103 through a supply server connector holder to supply the cooling fluid to flow from the rack manifold 105a to the server chassis 103. In an embodiment, the pair of server blind mating connectors include the return server connector 107b coupled with the server chassis 103 through a return server connector holder to return the cooling fluid to flow from the server chassis 103 to the rack manifold 105b.

Figure 5:
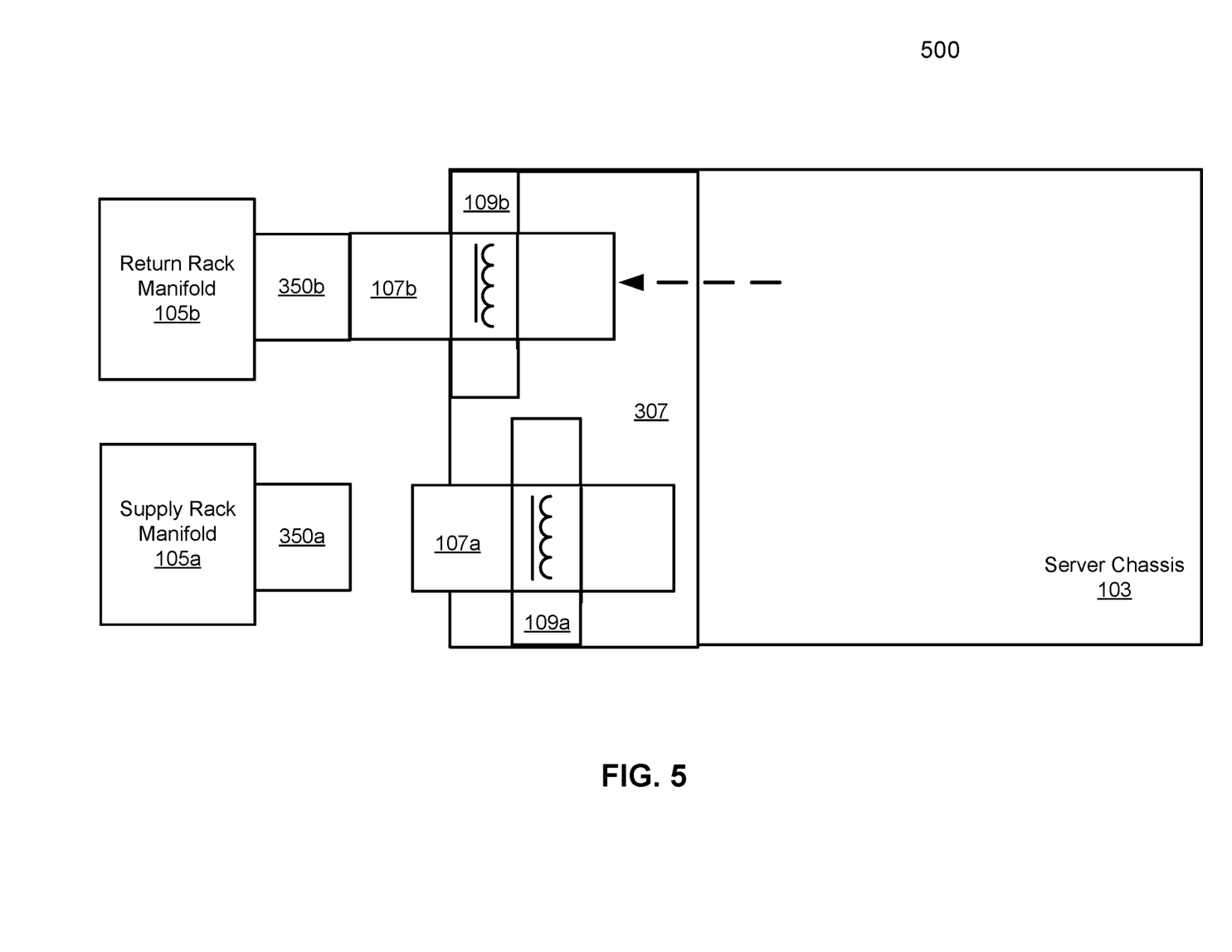
FIG. 5 shows an example of supply side disconnect mode during leakage scenario for the server liquid cooling fluid cutoff system according to an embodiment of the application

FIG. 5 shows an example supply side disconnect mode 500 of server liquid cooling fluid cutoff system, according to an embodiment of the application. For example, FIG. 5 shows the supply side disconnect mode 500 that supply connector 107a is disconnected while the returning side 107b continues to work. For example, a pump (not shown) is to continue to pump the fluid away from the server cooling module to minimize the amount of fluid leaking externally.

Figure 6:
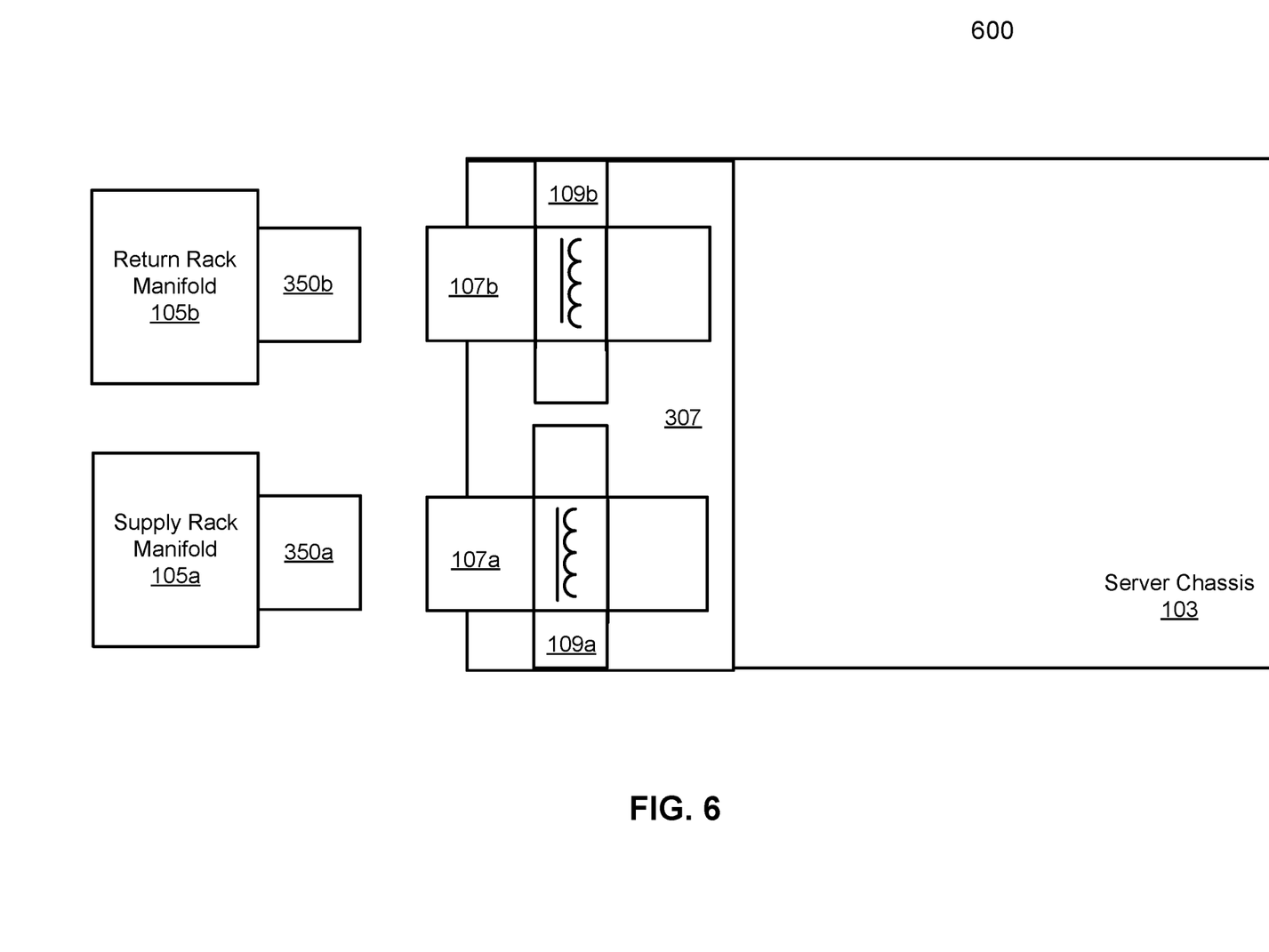
FIG. 6 shows an example of both sides disconnect mode during leakage scenario for the server liquid cooling fluid cutoff system according to an embodiment of the application.

FIG. 6 shows an example of both sides disconnect mode 600 during a leakage scenario for the server liquid cooling fluid cutoff system, according to an embodiment of the application. For example, FIG. 6 shows a full disconnection mode 600, after the remaining fluid within the cooling module has been removed from the chassis.

In an embodiment, after the remaining cooling fluid within the server chassis 113 pumped out, the return server connector 107b is pulled in toward to the server chassis 113 to disengage from the return rack connector. For example, the return server connector 107b is pulled in toward to the server chassis 103 when the magnetic field associated with the electromagnet 109b is modified to loss magnetism, which causes the return server connector 107b to disengage from the return rack connector. Further, in an embodiment, when the return server connector 107b is pulled in toward to the server chassis 103, the server chassis 103 and the rack manifold 105b are remained without moving.

Figure 7:
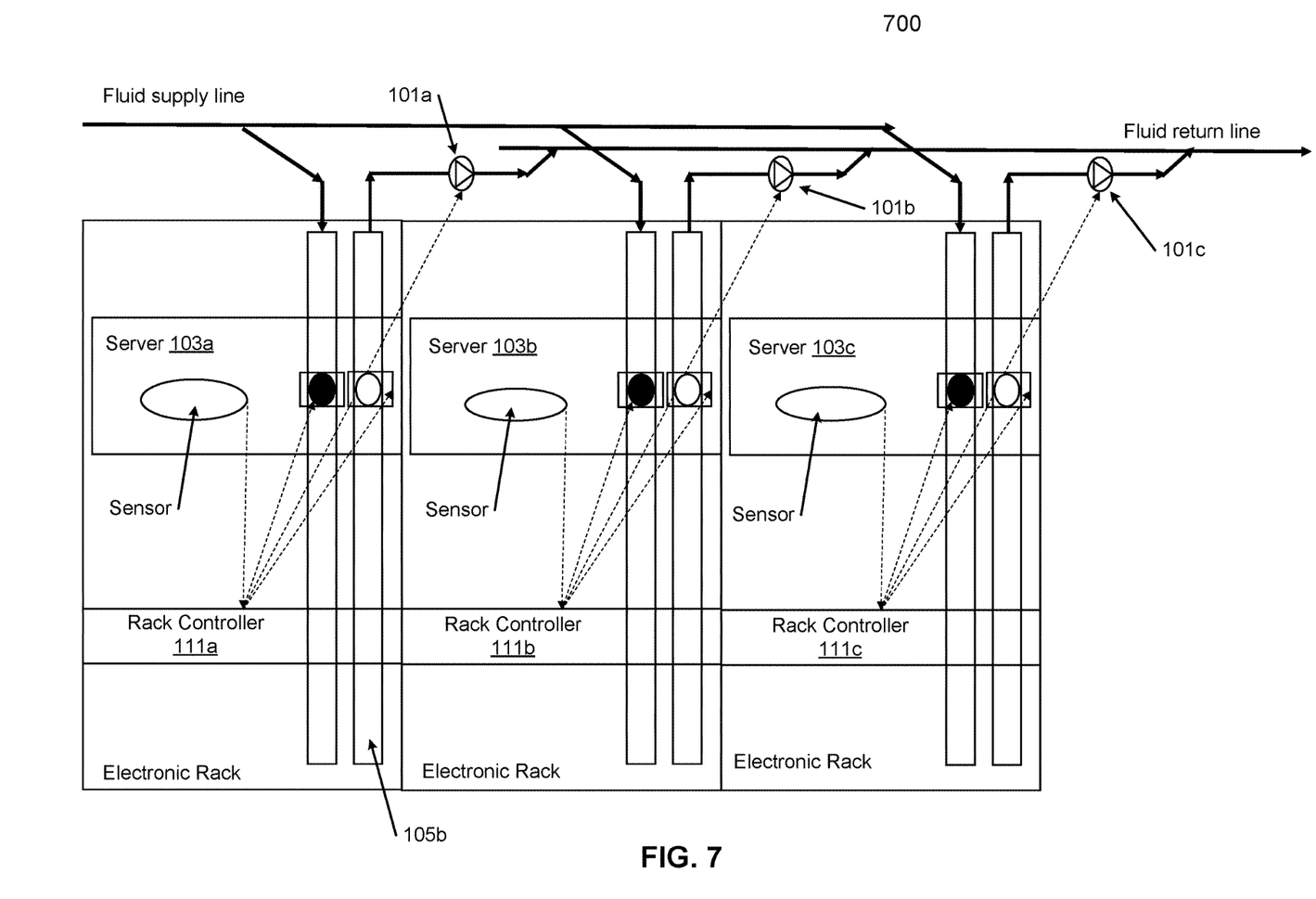
FIG. 7 shows a cluster design with localized pumps according to an embodiment of the application.

FIG. 7 shows a cluster design 700 with localized pumps 101a, 101b, 101c according to an embodiment of the application. For example, FIG. 7 shows a cluster level design 700 where each of the electronic racks is designed with localized pump (e.g., 101a), and individual rack controller (e.g., 111a, 111b, 111c) is used. The rack controller is used to determine a leakage and to control the switches to cut off power to the electromagnetic devices as described above.

Figure 8:
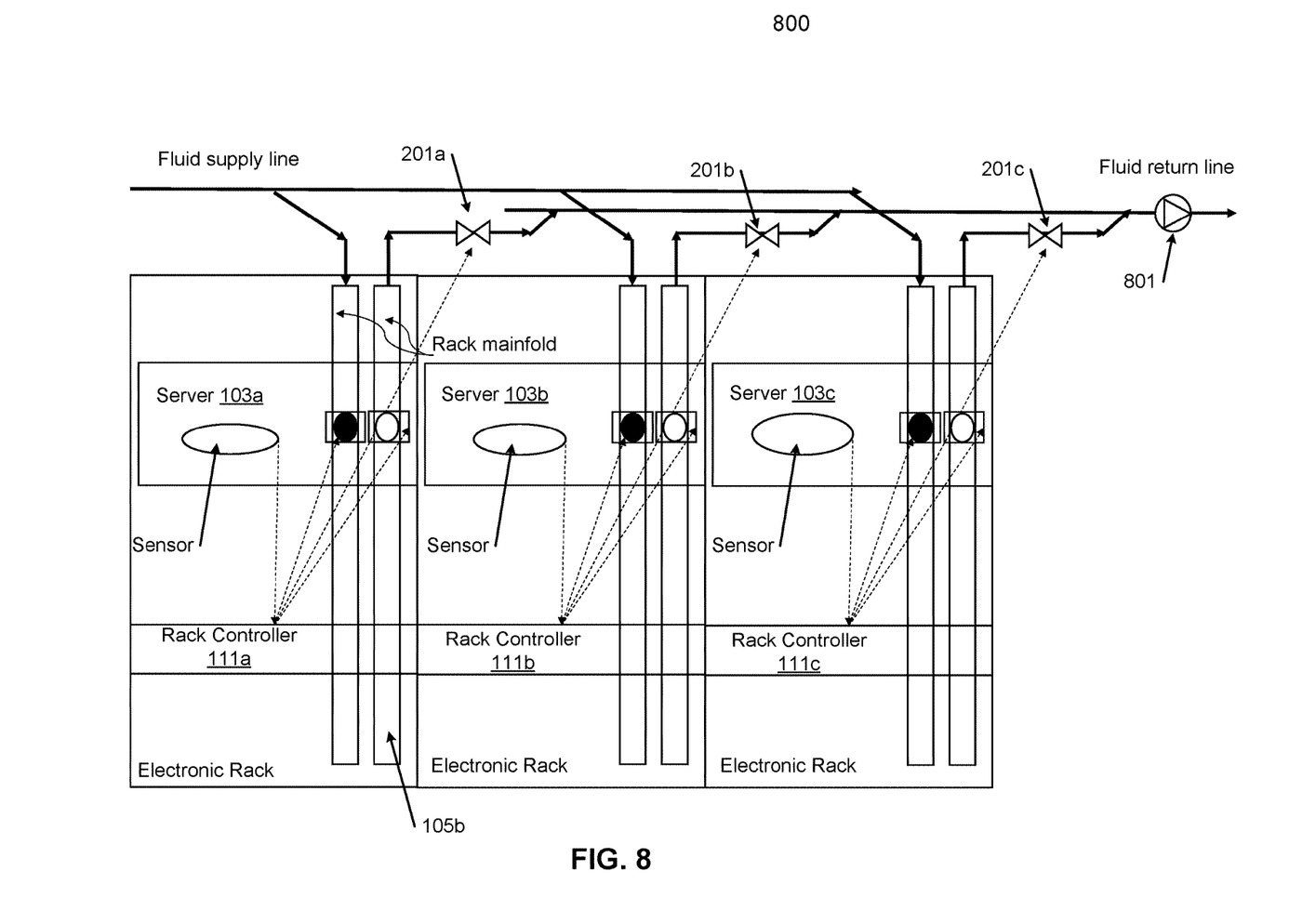
FIG. 8 shows a cluster design with a central pump according to an embodiment of the application.

FIG. 8 shows a cluster design 800 with a central pump 801 according to an embodiment of the application. For example, FIG. 8 shows the cluster design 800 with a central pump 801 and each of the racks is designed with valve (e.g., 201a, 201b, 201c). The corresponding valve (e.g., 201a) will be controlled to maximum open ratio to increase the fluid flow rate of the corresponding rack.

Figure 9:
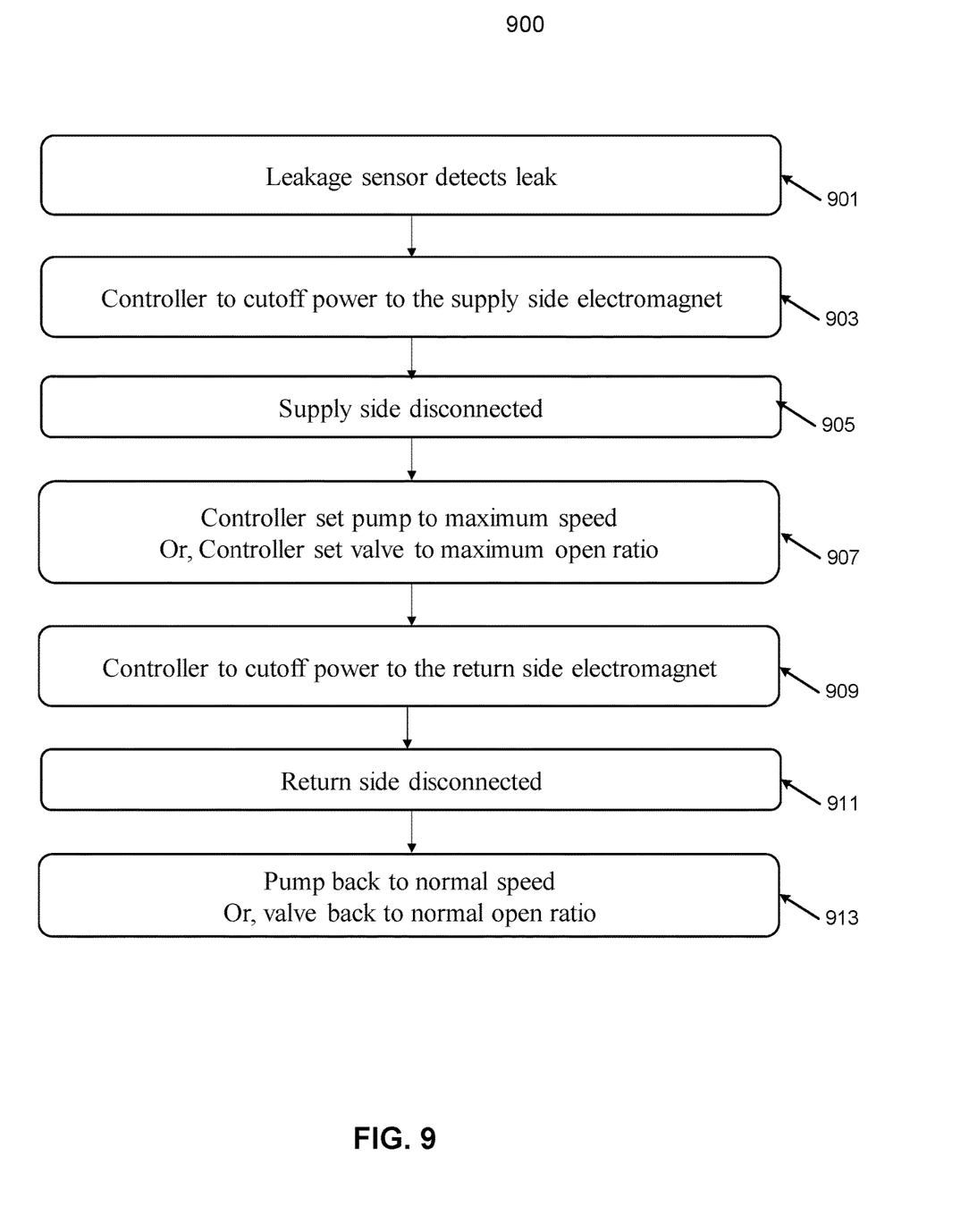
FIG. 9 shows an example system operation flow chart according to an embodiment of the application.

FIG. 9 shows an example system operation flow chart 900 of an example system operation according to an embodiment of the application. For example, FIG. 9 shows the operation flow chart 900 of the system to pump out all the remaining fluid as quick as possible to minimize the amount of fluid leaking to the chassis (e.g., 103a, 103b, 103c in FIG. 7, 8), to ensure other system continuous operation.

At operation 901, the leakage sensor 113 can detect a leak according to an embodiment. In an embodiment, at operation 903, controller 111 can cutoff the power to the supply side electromagnet 109a. For example, at operation 905, the supply side of the connector 107a is disconnected from the supply side of the rack manifold 105a. In an embodiment, at operation 907, controller 111 can set the pump 101 to the maximum speed, or in another embodiment, at operation 905, controller 111 can set valve 201 to the maximum open ratio. In an embodiment, at operation 909, controller 111 can cutoff power to the return side electromagnet 109b. In an embodiment, at operation 911, the return side of the connector 107b is disconnected from the return side of the rack manifold 105b. In an embodiment, at operation 913, pump 101 is back to the normal speed, or in another embodiment, the valve 201 is back to the normal open ratio.

Figure 10:
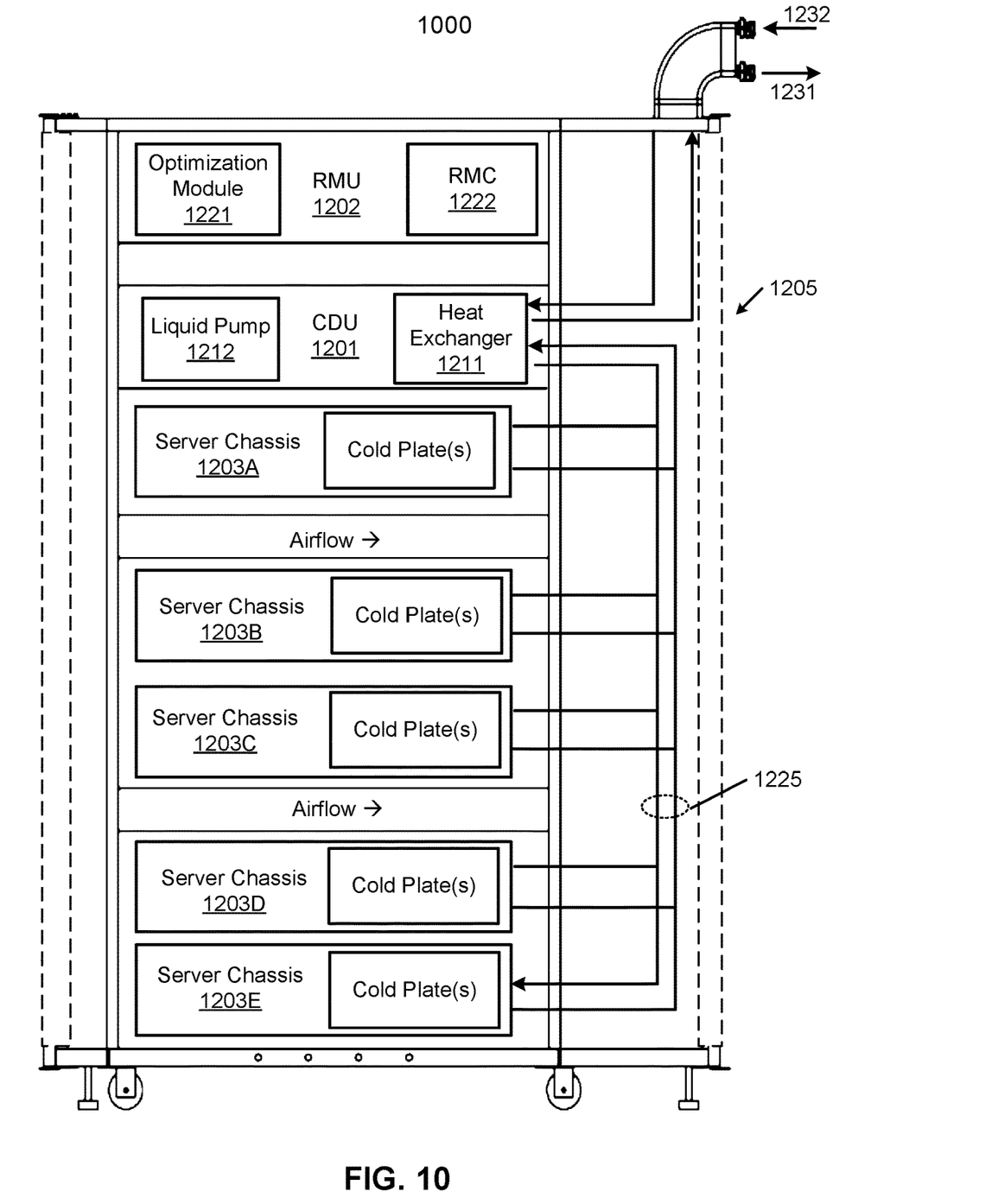
FIG. 10 is a block diagram illustrating an example of an electronic rack according to one embodiment.

FIG. 10 shows a cluster design with a central pump of another example system operation 1000 according to an embodiment of the application. Electronic rack 1200 may represent any of the electronic racks as described throughout this application. According to one embodiment, electronic rack 1200 includes, but is not limited to, coolant distribution unit (CDU) 1201, rack management unit (RMU) 1202, and one or more server chassis 1203A-1203E (collectively referred to as server chassis 1203). Server chassis 1203 can be inserted into an array of server slots (e.g., standard shelves) respectively from frontend 1204 or backend 1205 of electronic rack 1200. Note that although there are five server chassis 1203A-1203E shown here, more or fewer server chassis may be maintained within electronic rack 1200. Also note that the particular positions of CDU 1201, RMU 1202, and/or server chassis 1203 are shown for the purpose of illustration only; other arrangements or configurations of CDU 1201, RMU 1202, and/or server chassis 1203 may also be implemented. In one embodiment, electronic rack 1200 can be either open to the environment or partially contained by a rack container, as long as the cooling fans can generate airflows from the frontend to the backend.

In addition, for at least some of the server chassis 1203, an optional fan module (not shown) is associated with the server chassis. Each of the fan modules includes one or more cooling fans. The fan modules may be mounted on the back-ends of server chassis 1203 or on the electronic rack to generate airflows flowing from frontend 1204, traveling through the air space of the server chassis 1203, and existing at backend 1205 of electronic rack 1200.

In one embodiment, CDU 1201 mainly includes heat exchanger 1211, liquid pump 1212, and a pump controller (not shown), and some other components such as a liquid reservoir, a power supply, monitoring sensors and so on. Heat exchanger 1211 may be a liquid-to-liquid heat exchanger. Heat exchanger 1211 includes a first loop with inlet and outlet ports having a first pair of liquid connectors coupled to external liquid supply/return lines 1231-1232 to form a primary loop. The connectors coupled to the external liquid supply/return lines 1231-1232 may be disposed or mounted on backend 1205 of electronic rack 1200. The liquid supply/return lines 1231-1232, also referred to as room liquid supply/return lines, may be coupled to an external cooling system.

In addition, heat exchanger 1211 further includes a second loop with two ports having a second pair of liquid connectors coupled to liquid manifold 1225 (also referred to as a rack manifold) to form a secondary loop, which may include a supply manifold (also referred to as a rack liquid supply line or rack supply manifold) to supply cooling liquid to server chassis 1203 and a return manifold (also referred to as a rack liquid return line or rack return manifold) to return warmer liquid back to CDU 1201. Note that CDUs 1201 can be any kind of CDUs commercially available or customized ones. Thus, the details of CDUs 1201 will not be described herein.

Each of server chassis 1203 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 1203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 1200 further includes optional RMU 1202 configured to provide and manage power supplied to servers 1203, and CDU 1201. RMU 1202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to the rest of the components of electronic rack 1200.

In one embodiment, RMU 1202 includes optimization module 1221 and rack management controller (RMC) 1222. RMC 1222 may include a monitor to monitor operating status of various components within electronic rack 1200, such as, for example, computing nodes 1203, CDU 1201, and the fan modules. Specifically, the monitor receives operating data from various sensors representing the operating environments of electronic rack 1200. For example, the monitor may receive operating data representing temperatures of the processors, cooling liquid, and airflows, which may be captured and collected via various temperature sensors. The monitor may also receive data representing the fan power and pump power generated by the fan modules and liquid pump 1212, which may be proportional to their respective speeds. These operating data are referred to as real-time operating data. Note that the monitor may be implemented as a separate module within RMU 1202.

Based on the operating data, optimization module 1221 performs an optimization using a predetermined optimization function or optimization model to derive a set of optimal fan speeds for the fan modules and an optimal pump speed for liquid pump 1212, such that the total power consumption of liquid pump 1212 and the fan modules reaches minimum, while the operating data associated with liquid pump 1212 and cooling fans of the fan modules are within their respective designed specifications. Once the optimal pump speed and optimal fan speeds have been determined, RMC 1222 configures liquid pump 1212 and cooling fans of the fan modules based on the optimal pump speeds and fan speeds.

As an example, based on the optimal pump speed, RMC 1222 communicates with a pump controller of CDU 1201 to control the speed of liquid pump 1212, which in turn controls a liquid flow rate of cooling liquid supplied to the liquid manifold 1225 to be distributed to at least some of server chassis 1203. Similarly, based on the optimal fan speeds, RMC 1222 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown is described for the purpose of illustration only; other configurations or arrangements may also be applicable. For example, CDU 1201 may be an optional unit. The cold plates of server chassis 1203 may be coupled to a rack manifold, which may be directly coupled to room manifolds 1231-1232 without using a CDU. Although not shown, a power supply unit may be disposed within electronic rack 1200. The power supply unit may be implemented as a standard chassis identical or similar to a server chassis, where the power supply chassis can be inserted into any of the standard shelves, replacing any of server chassis 1203. In addition, the power supply chassis may further include a battery backup unit (BBU) to provide battery power to server chassis 1203 when the main power is unavailable. The BBU may include one or more battery packages and each battery package include one or more battery cells, as well as the necessary charging and discharging circuits for charging and discharging the battery cells.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack, comprising:

a rack manifold to be coupled to an external cooling fluid source, including a supply rack manifold and a return rack manifold, wherein the rack manifold includes a plurality of pairs of rack connectors disposed thereon to receive and to return cooling fluid from and to the external cooling fluid source via the supply rack manifold and the return rack manifold;

a server chassis including a connector holder having a pair of a supply server connector and a return server connector to be connected with a corresponding pair of rack connectors of the rack manifold, wherein the supply and return server connectors are configured to distribute the cooling fluid to one or more cooling devices attached to one or more electronic devices contained within the server chassis for liquid cooling, wherein the server chassis further comprises a first electromagnetic device fixedly attached to the supply server connector, wherein a controller is to control the first electromagnetic device to disconnect the supply server connector from the supply rack manifold in response to detecting a leakage, wherein the server chassis further comprises a second electromagnetic device fixedly attached to the return server connector, wherein the controller is to control the second electromagnetic device to disconnect the return server connector from the return rack manifold in response to detecting the leakage; and the controller, in response to detecting the leakage of the cooling fluid, configured to:
cause the supply server connector to disconnect from the supply rack manifold, while maintaining the return server connector connected with the return rack manifold, and
increase a flowrate of the cooling fluid on the return rack manifold to remove the cooling fluid residing within the server chassis.

2. The electronic rack of claim 1, wherein the server chassis further comprises a leaking sensor coupled to the controller and configured to detect the leakage of the cooling fluid within the server chassis.

3. The electronic rack of claim 1, wherein to increase the flowrate of the cooling fluid, the controller is configured to increase a pump speed of a fluid pump coupled to the return rack manifold.

4. The electronic rack of claim 3, wherein the pump speed of the fluid pump is increased to its maximum pump speed.

5. The electronic rack of claim 3, wherein the fluid pump is disposed between the return rack manifold and a facility fluid return line of a data center room coupled to a plurality of electronic racks.

6. The electronic rack of claim 1, wherein to increase the flowrate of the cooling fluid, the controller is configured to increase an opening of a valve coupled to the return rack manifold.

7. The electronic rack of claim 6, wherein the opening of the valve is increased to its maximum opening.

8. The electronic rack of claim 6, wherein the valve is disposed between the return rack manifold and a facility fluid return line of a data center room coupled to a plurality of electronic racks.

9. The electronic rack of claim 1, wherein the controller further causes the return server connector to disconnect from the return rack manifold after a predetermined period of time after the supply server connector has been disconnected from the supply rack manifold.

10. The electronic rack of claim 1, wherein the controller further causes the return server connector to disconnect from the return rack manifold after a predetermined amount of cooling fluid has been removed from the server chassis.

11. The electronic rack of claim 1, wherein the controller causes power to be removed from the first electromagnetic device, which causes the supply server connector to move away from the supply rack manifold.

12. The electronic rack of claim 1, wherein the controller causes power to be removed from the second electromagnetic device, which causes the return server connector to move away from the return rack manifold.

13. A data center cooling system, comprising:
a fluid supply line coupled to receive cooling fluid from a cooling fluid source;
a fluid return line coupled to return the cooling fluid to the cooling fluid source;
a plurality of electronic racks coupled to the fluid supply line and the fluid return line,
wherein each of the electronic racks comprises:
a rack manifold including a supply rack manifold coupled to the fluid supply line and a return rack manifold coupled to the fluid return line, wherein the rack manifold includes a plurality of pairs of rack connectors disposed thereon to receive and to return cooling fluid from and to the cooling fluid source via the supply rack manifold and the return rack manifold,
a server chassis including a connector holder having a pair of a supply server connector and a return server connector to be connected with a corresponding pair of rack connectors of the rack manifold, wherein the supply and return server connectors are configured to distribute the cooling fluid to one or more cooling devices attached to one or more electronic devices contained within the server chassis for liquid cooling, wherein the server chassis further comprises a first electromagnetic device fixedly attached to the supply server connector, wherein a controller is to control the first electromagnetic device to disconnect the supply server connector from the supply rack manifold in response to detecting a leakage, wherein the server chassis further comprises a second electromagnetic device fixedly attached to the return server connector, wherein the controller is to control the second electromagnetic device to disconnect the return server connector from the return rack manifold in response to detecting the leakage; and
the controller, in response to detecting the leakage of the cooling fluid, configured to:
cause the supply server connector to disconnect from the supply rack manifold, while maintaining the return server connector connected with the return rack manifold, and
increase a flowrate of the cooling fluid on the return rack manifold to remove the cooling fluid residing within the server chassis.

14. The data center cooling system of claim 13, wherein the server chassis further comprises a leaking sensor coupled to the controller and configured to detect the leakage of the cooling fluid within the server chassis.

15. The data center cooling system of claim 13, wherein to increase the flowrate of the cooling fluid, the controller is configured to increase a pump speed of a fluid pump coupled to the return rack manifold.

16. The data center cooling system of claim 15, wherein the pump speed of the fluid pump is increased to its maximum pump speed.

17. The data center cooling system of claim 15, wherein the fluid pump is disposed between the return rack manifold and a facility fluid return line of a data center room coupled to the plurality of electronic racks.

18. The data center cooling system of claim 13, wherein to increase the flowrate of the cooling fluid, the controller is configured to increase an opening of a valve coupled to the return rack manifold.

* * * * *